United States Patent
Tsujimoto

(10) Patent No.: US 8,328,981 B2
(45) Date of Patent: Dec. 11, 2012

(54) METHOD FOR HEATING A FOCUS RING IN A PLASMA APPARATUS BY HIGH FREQUENCY POWER WHILE NO PLASMA BEING GENERATED

(75) Inventor: Hiroshi Tsujimoto, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 381 days.

(21) Appl. No.: 12/685,151

(22) Filed: Jan. 11, 2010

(65) Prior Publication Data

US 2010/0181294 A1    Jul. 22, 2010

(30) Foreign Application Priority Data

Jan. 19, 2009  (JP) .................. 2009-009321

(51) Int. Cl.
C23F 1/08 (2006.01)
H01L 21/302 (2006.01)

(52) U.S. Cl. ......... 156/345.37; 156/345.39; 219/121.41; 219/121.43; 438/714; 438/715; 438/729

(58) Field of Classification Search ............. 156/345.37, 156/345.39; 219/121.41, 121.43
See application file for complete search history.

(56) References Cited

U.S. PATENT DOCUMENTS

| | | | | |
|---|---|---|---|---|
| 5,529,657 A * | 6/1996 | Ishii | ......................... | 156/345.26 |
| 5,571,366 A * | 11/1996 | Ishii et al. | ................. | 156/345.26 |
| 5,695,564 A * | 12/1997 | Imahashi | ....................... | 118/719 |
| 5,900,103 A * | 5/1999 | Tomoyasu et al. | ........ | 156/345.44 |
| 5,928,963 A * | 7/1999 | Koshiishi | ....................... | 438/714 |
| 5,942,075 A * | 8/1999 | Nagahata et al. | ......... | 156/345.47 |
| 5,997,962 A * | 12/1999 | Ogasawara et al. | ............ | 427/535 |
| 6,506,686 B2 * | 1/2003 | Masuda et al. | ................ | 438/715 |
| 6,676,804 B1 * | 1/2004 | Koshimizu et al. | ....... | 156/345.53 |
| 7,265,963 B2 * | 9/2007 | Hirose | .......................... | 361/234 |
| 8,124,539 B2 * | 2/2012 | Endoh et al. | ................... | 438/714 |

(Continued)

FOREIGN PATENT DOCUMENTS

JP    2001-156051 A    6/2001

(Continued)

*Primary Examiner* — Anh Mai
(74) *Attorney, Agent, or Firm* — Rothwell, Figg, Ernst & Manbeck, P.C.

(57) ABSTRACT

A plasma etching apparatus includes a vacuum processing chamber; a lower electrode, i.e., a mounting table for mounting the substrate, provided in the vacuum processing chamber; an upper electrode provided to face the lower electrode; a gas supply unit for supplying a processing gas to the vacuum processing chamber; a high frequency power supply unit for supplying a high frequency power to the lower electrode; and a focus ring provided on the lower electrode to surround a periphery of the substrate. In a method for performing a plasma etching on a substrate by using the plasma etching apparatus, a plasma is generated in the vacuum processing chamber to perform the plasma etching on the substrate by using the plasma after the focus ring is heated by supplying a high frequency power from the high frequency power supply unit to the lower electrode under a condition that no plasma is generated.

8 Claims, 5 Drawing Sheets

U.S. PATENT DOCUMENTS

| | | |
|---|---|---|
| 2002/0005252 A1* | 1/2002 | Masuda et al. ............... 156/345 |
| 2005/0142873 A1 | 6/2005 | Shindo et al. |
| 2008/0149598 A1* | 6/2008 | Hayashi et al. ............... 216/67 |
| 2008/0237182 A1* | 10/2008 | Yamawaku et al. ............ 216/59 |
| 2010/0213171 A1* | 8/2010 | Koshimizu et al. ............ 216/67 |
| 2010/0243606 A1* | 9/2010 | Koshimizu et al. ............ 216/67 |
| 2010/0243620 A1* | 9/2010 | Yamawaku et al. ...... 219/121.54 |
| 2011/0211817 A1* | 9/2011 | Yamawaku et al. ........... 392/416 |
| 2011/0220288 A1* | 9/2011 | Kobayashi et al. ...... 156/345.27 |
| 2011/0266257 A1* | 11/2011 | Nishizuka et al. .............. 216/69 |

FOREIGN PATENT DOCUMENTS

| | | |
|---|---|---|
| JP | 2007-208302 | 8/2007 |
| JP | 2007-294905 A | 11/2007 |
| JP | 2008-159931 A | 7/2008 |

* cited by examiner

10mT, 0/ *W, O₂=100sccm, *min

| RF Time | 0 | 1 | 3 | 5 |
|---|---|---|---|---|
| 10mT, 0/ 500W | 40 | 57 | 85 | 113 |
| 10mT, 0/ 1000W | 40 | 63 | 118 | 157 | ns
METHOD FOR HEATING A FOCUS RING IN A PLASMA APPARATUS BY HIGH FREQUENCY POWER WHILE NO PLASMA BEING GENERATED

CROSS-REFERENCE TO RELATED APPLICATIONS

This application claims priority to Japanese Patent Application No. 2009-009321 filed on Jan. 19, 2009, the entire contents of which are incorporated herein by reference.

FIELD OF THE INVENTION

The present invention relates to a method for heating a focus ring provided in a plasma etching apparatus that etches a substrate such as a semiconductor wafer, a glass substrate for a liquid crystal display apparatus, and the like by using a plasma, a plasma etching method, a plasma etching apparatus, and a computer-readable storage medium therefor.

BACKGROUND OF THE INVENTION

In general, a plasma etching apparatus for etching a substrate such as a semiconductor wafer and a glass substrate for a liquid crystal display apparatus by using a plasma has been employed in a manufacturing process of semiconductor devices or the like.

The plasma etching apparatus is typically configured to include, e.g., a vacuum processing chamber; a lower electrode provided in the processing chamber, the lower electrode also serving as a mounting table on which a substrate is mounted; and an upper electrode provided to face the lower electrode. A high frequency power is supplied to the lower electrode to generate a plasma of a processing gas. Further, the plasma etching apparatus includes a focus ring provided on the lower electrode to surround a periphery of the substrate in order to improve an in-plane uniformity of processing on the substrate (see, e.g., Japanese Patent Application Pub. No. 2007-208302 and corresponding U.S. Patent Application Pub. No. 2005/0142873 A1).

In the plasma etching apparatus, when a plurality of substrates is successively subjected to the plasma etching, the temperature of the focus ring is gradually increased from a room temperature as the focus ring is exposed to the plasma. For that reason, without dealing with such change of temperature, the first substrate firstly subjected to the plasma etching has a processed state different from those of the second and following substrates subjected to the plasma etching. To prevent the occurrence of such a problem, a plasma is conventionally generated in the vacuum processing chamber while a dummy substrate is mounted on the lower electrode and the focus ring is heated by the plasma, before the start of the processing of substrates.

If a plasma is generated in the vacuum processing chamber while no dummy substrate is mounted, the surface of an electrostatic chuck provided on the lower electrode to electrostatically attract the substrate may be damaged by the plasma. Accordingly, as described above, the plasma is generated in the vacuum processing chamber while the dummy substrate is mounted on the lower electrode.

However, if the plasma is generated in the vacuum processing chamber to heat the focus ring by the plasma as described above, the focus ring and other members included in the vacuum processing chamber may be worn out. Further, if the focus ring is heated in this way, it becomes necessary to manage a frequency of using the dummy substrate or the like and provide an accommodation part (slot) for accommodating the dummy substrate.

SUMMARY OF THE INVENTION

In view of the above, the present invention provides a focus ring heating method, a plasma etching method, a plasma etching apparatus, and a computer-readable storage medium, in which members inside a vacuum chamber can be suppressed from being worn out without a dummy substrate as compared with a conventional method.

In accordance with an aspect of the present invention, there is provided a method for heating a focus ring in a plasma etching apparatus. The plasma etching apparatus includes a vacuum processing chamber; a lower electrode provided in the vacuum processing chamber, the lower electrode also serving as a mounting table for mounting a substrate thereon; an upper electrode provided to face the lower electrode; a gas supply unit for supplying a processing gas to the vacuum processing chamber; a high frequency power supply unit for supplying a high frequency power to the lower electrode; and a focus ring provided on the lower electrode to surround a periphery of the substrate. The method includes: heating the focus ring by supplying the high frequency power from the high frequency power supply unit to the lower electrode under a condition that no plasma is generated.

In accordance with another aspect of the present invention, there is provided a method for performing a plasma etching on a substrate by using a plasma etching apparatus. The plasma etching apparatus includes a vacuum processing chamber; a lower electrode provided in the vacuum processing chamber, the lower electrode also serving as a mounting table for mounting the substrate thereon; an upper electrode provided to face the lower electrode; a gas supply unit for supplying a processing gas to the vacuum processing chamber; a high frequency power supply unit for supplying a high frequency power to the lower electrode; and a focus ring provided on the lower electrode to surround a periphery of the substrate. The method includes: heating the focus ring by supplying the high frequency power from the high frequency power supply unit to the lower electrode under a condition that no plasma is generated; and generating a plasma in the vacuum processing chamber to perform the plasma etching on the substrate by using the plasma.

In accordance with yet another aspect of the present invention, there is provided a plasma etching apparatus including a vacuum processing chamber; a lower electrode provided in the vacuum processing chamber, the lower electrode also serving as a mounting table for mounting the substrate thereon; an upper electrode provided to face the lower electrode; a gas supply unit for supplying a processing gas to the vacuum processing chamber; a high frequency power supply unit for supplying a high frequency power to the lower electrode; and a focus ring provided on the lower electrode to surround a periphery of the substrate. After the focus ring is heated by supplying the high frequency power from the high frequency power supply unit to the lower electrode under a condition that no plasma is generated, a plasma is generated in the vacuum processing chamber to perform the plasma etching on the substrate by using the plasma.

In accordance with still another aspect of the present invention, there is provided a computer-readable storage medium which stores a computer-executable control program for controlling a plasma etching apparatus to carry out the plasma etching method

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Figure 1:
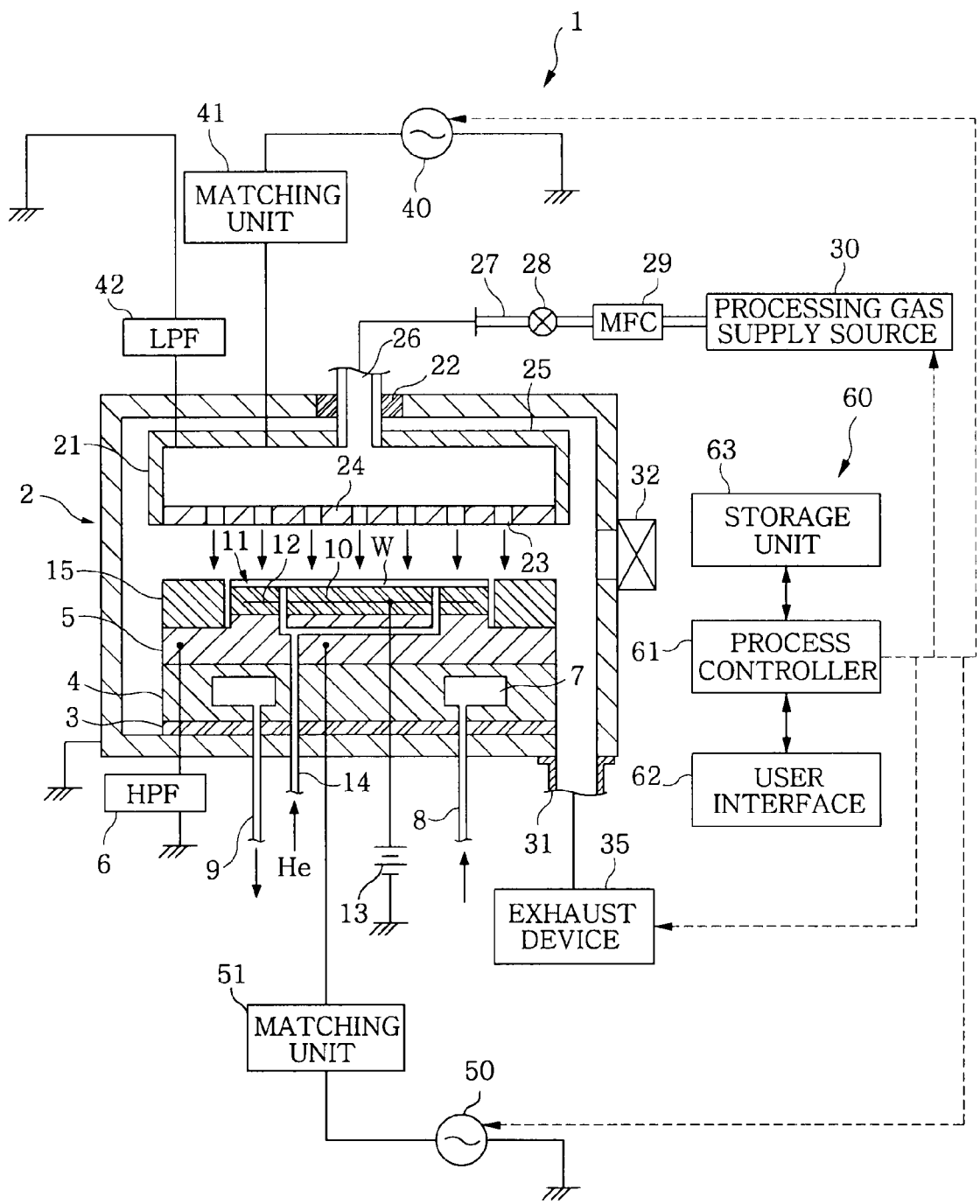
FIG. 1 shows a structure of a plasma etching apparatus in accordance with an embodiment of the present invention.

An embodiment of the present invention will now be described with reference to the accompanying drawings which form a part hereof. FIG. 1 shows a structure of a plasma etching apparatus 1 in accordance with the embodiment of the present invention. First, the structure of the plasma etching apparatus 1 will be described with reference to FIG. 1.

The plasma etching apparatus 1 is a capacitively coupled parallel plate type etching apparatus in which electrode plates are arranged at an upper and a lower portion, respectively, to face each other in parallel and connected to a plasma generating power supply.

The plasma etching apparatus 1 includes a cylindrical vacuum processing chamber 2 made of, e.g., aluminum whose surface is anodically oxidized. The vacuum processing chamber 2 is grounded. At a bottom portion in the vacuum processing chamber 2, a substantially cylindrical susceptor support 4 for mounting thereon a target substrate, e.g., a semiconductor wafer W is provided via an insulating plate 3 made of, e.g., a ceramic or the like. Further, a susceptor (mounting table) 5 serving as a lower electrode is provided on the susceptor support 4. A high pass filter (HPF) 6 is connected to the susceptor 5.

A coolant path 7 is provided inside the susceptor support 4. A coolant is supplied via a coolant introducing pipe 8 to be circulated in the coolant path 7 and exhausted from a coolant exhaust pipe 9 and a cold heat of the coolant is transferred to the semiconductor wafer W via the susceptor 5. In this way, the temperature of the semiconductor wafer W is controlled to a desired level.

The susceptor 5 is formed into a circular plate shape having a protruded upper central portion. Provided on the susceptor 5 is an electrostatic chuck 11 having a substantially same shape as the semiconductor wafer W. The electrostatic chuck 11 includes therein an electrode 12 interposed between insulating members. By applying a DC voltage of, e.g., about 1.5 kV from a DC power supply 13 connected to the electrode 12, the semiconductor wafer W is attracted to and held on the electrostatic chuck 11 by, e.g., a Coulomb force.

A gas channel 14, through which a heat transfer medium (e.g., He gas) is supplied to a backside of the semiconductor wafer W, is formed in the insulating plate 3, the susceptor support 4, the susceptor 5, and the electrostatic chuck 11. Accordingly, a cold heat of the susceptor 5 is transferred to the semiconductor wafer W by the heat transfer medium, to thereby maintain the temperature of the semiconductor wafer W at a predetermined level.

A ring-shaped focus ring 15 is arranged on an upper peripheral portion of the susceptor 5 to surround the semiconductor wafer W mounted on the electrostatic chuck 11. The focus ring 15 is made of, e.g., silicon or the like, to thereby improve an in-plane uniformity of etching.

An upper electrode 21 is provided above the susceptor 5 to face the susceptor 5 in parallel. The upper electrode 21 is held at an upper portion of the vacuum processing chamber 2 through an insulating member 22. The upper electrode 21 includes an electrode plate 24, and an electrode holder 25 made of, e.g., a conductive material for holding the electrode plate 24. The electrode plate 24 has a plurality of injection holes 12 made of, e.g., a conductor or a semiconductor. The electrode plate 24 faces the susceptor 5.

In the upper electrode 21, a gas inlet port 26 is provided at a central portion of the electrode holder 25 and a gas supply pipe 27 is connected to the gas inlet port 26. A processing gas supply source 30 is connected to the gas supply pipe 27 via a valve 28 and a mass flow controller (MFC) 29. A processing gas for plasma etching is supplied from the processing gas supply source 30.

An exhaust pipe 31 is connected to a bottom portion of the vacuum processing chamber 2 and an exhaust device 35 is connected to the exhaust pipe 31. The exhaust device 35 includes a vacuum pump such as a turbo molecular pump or the like to exhaust the inside of the chamber 2 to be depressurized to a vacuum level, e.g., about 1 Pa or less.

Moreover, a gate valve 32 is provided in a sidewall of the vacuum processing chamber 2. While the gate valve 32 is opened, the semiconductor wafer W is transferred between the vacuum processing chamber 2 and an adjacent load-lock chamber (not shown).

A first high frequency power supply 40 is connected to the upper electrode 21 via a matching unit 41 by using a power supply wire. Moreover, a low pass filter (LPF) is connected to the upper electrode 21. A high frequency power of, e.g., about 50 to 150 MHz is supplied from the first high frequency power supply 40. As such, by supplying a high frequency power of a relatively high frequency, it is possible to generate a high density plasma in a desired dissociation state.

A second high frequency power supply 50 is connected to the susceptor 5 serving as the lower electrode via a matching unit 51 by using a power supply wire. A second high frequency power supplied from the second high frequency power supply 50 has a lower frequency range than that supplied from the first high frequency power supply 40. By supplying the high frequency power of, e.g., 20 MHz or less (13.56 MHz in the present embodiment) from the second high frequency power supply 50, it is possible to apply an adequate ion action to the semiconductor wafer W as the target object without damaging it.

An operation of the plasma etching apparatus 1 is generally controlled by a control unit 60. The control unit 60 includes a process controller having a central processing unit (CPU) to control various components of the plasma etching apparatus 1; a user interface 62; and a storage unit 63.

The user interface 62 includes a keyboard through which an operator inputs a command or the like to operate or manage the plasma etching apparatus 1, a display through which an operation status of the plasma etching apparatus 1 is visually displayed, and the like.

The storage unit 63 stores control programs (software) for performing various processes of the plasma etching apparatus 1 under the control of the process controller 61; and recipes having processing condition data and the like. As necessary, a desired process of the plasma etching apparatus is performed under the control of the process controller 61 by reading from the storage unit 63 a recipe corresponding to a command or the like inputted through the user interface 62 to be executed by the process controller 61.

The control program and the recipes having processing condition data and the like may be stored in a computer-readable storage medium. The storage medium may be, e.g., a hard disk, CD, a flexible disk, a semiconductor memory, or the like. Alternatively, the control program and the recipes may be adequately transmitted on-line from another apparatus through, e.g., a dedicated line.

When the plasma etching is performed on the semiconductor wafer W in the plasma etching apparatus 1, the gate valve 32 is first opened and the semiconductor wafer W is loaded from the load-lock chamber (not shown) into the vacuum processing chamber 2 to be mounted on the electrostatic chuck 11. Then, by applying a DC voltage from the DC power supply 13, the semiconductor wafer W is attracted to and held on the electrostatic chuck 11. Successively, the gate valve 32 is closed and the vacuum processing chamber 2 is exhausted to a preset vacuum level by the exhaust device 35.

Thereafter, the valve 28 is opened and a processing gas is supplied from the processing gas supply source 30 to a hollow portion of the upper electrode 21 via the gas supply pipe 27 and the gas inlet port 26, while the flow rate of the processing gas is being adjusted by the mass flow controller 29. Then, the processing gas is injected through the injection holes 23 of the electrode plate 24 uniformly over the semiconductor wafer W as pointed by arrows illustrated in FIG. 1.

The pressure inside the vacuum processing chamber 2 is maintained at a preset level. Then, by supplying a high frequency power of a preset frequency from the first high frequency power supply 40 to the upper electrode 21, a high frequency electric field is generated between the upper electrode 21 and the susceptor 5 serving as the lower electrode, so that the processing gas is decomposed to be converted to a plasma.

In the meantime, a high frequency power having a lower frequency than that of the high frequency power supplied from the first high frequency power 40 is supplied from the second high frequency power 50 to the susceptor 5 serving as the lower electrode. Accordingly, the ions in the plasma are attracted to the susceptor 5, to thereby improve an etching anisotropy by ion assist.

Next, if the plasma etching process is completed, the supplies of the high frequency power and the processing gas are stopped and the semiconductor wafer W is unloaded from the vacuum processing chamber 2 in reverse order.

Figure 2:
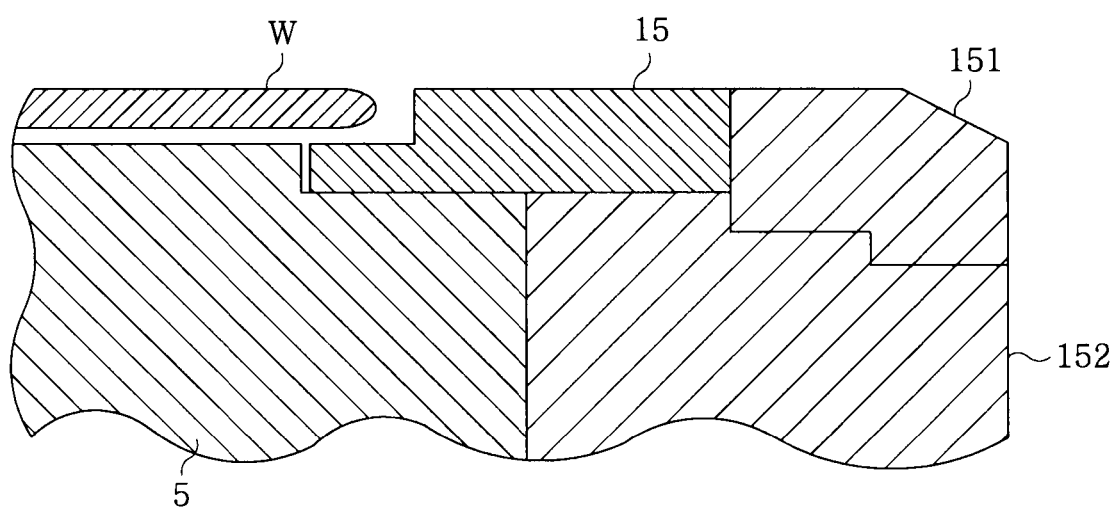
FIG. 2 is a partially enlarged view showing main parts of the plasma etching apparatus shown in FIG. 1.

FIG. 2 is a partially enlarged view showing the susceptor 5 and the focus ring 15 of the plasma etching apparatus 1. As shown in FIG. 2, the focus ring 15 is mounted on the susceptor 5 serving as the lower electrode to surround the periphery of the semiconductor W. In addition, as shown in FIG. 2, members 151 and 152 made of quartz or the like are arranged to surround the peripheries of the susceptor 5 and the focus ring 15.

In the case that the semiconductor wafer W is subjected to the plasma etching, when a plasma is generated inside the vacuum processing chamber 2, the focus ring 15 is exposed to the plasma. For that reason, as the plasma etching is performed on the semiconductor wafer W, the focus ring having a room temperature at first is heated by the plasma to a high temperature.

Moreover, when a plurality of semiconductor wafers is successively subjected to the plasma etching, the focus ring has the room temperature before the plasma etching process is performed on the first semiconductor wafer W. However, the focus ring 15 is heated as the plasma etching process is performed on the first semiconductor wafer W, thereby gradually increasing the temperature of the focus ring 15.

After the plasma etching process of the first semiconductor wafer W is completed, the first semiconductor wafer W is unloaded from the vacuum processing chamber 2. The focus ring 15 is cooled to some extent until the second semiconductor w is loaded in the vacuum processing chamber 2 and subjected to the plasma etching process.

Thereafter, the focus ring 15 is heated again as the plasma etching process is started to be performed on the second semiconductor wafer W. As the focus ring 15 is repeatedly heated and cooled, the temperature of the focus ring 15 has a constant range.

As such, since the temperature of the focus ring 15 is changed depending on the start of the plasma etching process, without dealing with such change of temperature, especially, the first semiconductor wafer W has a processed state different from those of the second and following semiconductor wafers W subjected to the plasma etching due to the difference in the temperature of the focus ring 15.

For that reason, a plasma is conventionally generated in the vacuum processing chamber 2 while a dummy wafer is mounted on the susceptor 5, and the focus ring 15 is heated by the plasma before the processing of the semiconductor wafer W is started. If a plasma is generated in the vacuum processing chamber 2 while no dummy wafer is mounted on the susceptor 5, the surface of the electrostatic chuck 11 provided on the susceptor 5 may be damaged by the plasma. Accordingly, the dummy wafer is used in the conventional method.

However, if the focus ring 15 is heated in this way, the focus ring 15 and other members included in the vacuum processing chamber 2 are worn out. Further, if the focus ring 15 is heated as described above, it becomes necessary to manage a frequency of using the dummy wafer or the like and provide an accommodation part (slot) for accommodating the dummy wafer.

In the present embodiment, for example, before the processing of the first semiconductor wafer W is started, the focus ring 15 is heated during a preset period of time by supplying a high frequency power from the second high frequency power supply 50 to the susceptor 5 serving as the lower electrode under the condition that no plasma is generated in the vacuum processing chamber 2. After the focus ring 15 is heated as described above, the processing of the first semiconductor wafer W is started.

As such, in accordance with the present embodiment, it is not necessary to employ the dummy wafer since the focus ring 15 is heated under the condition that no plasma is generated. Further, when the focus ring 15 is heated, the focus ring 15 and other members included in the vacuum processing chamber 2 are not worn out due to no exposure to plasma. Here, the focus ring 15 may be heated regardless of whether or not a semiconductor wafer W is mounted on the susceptor 5.

Figure 3:
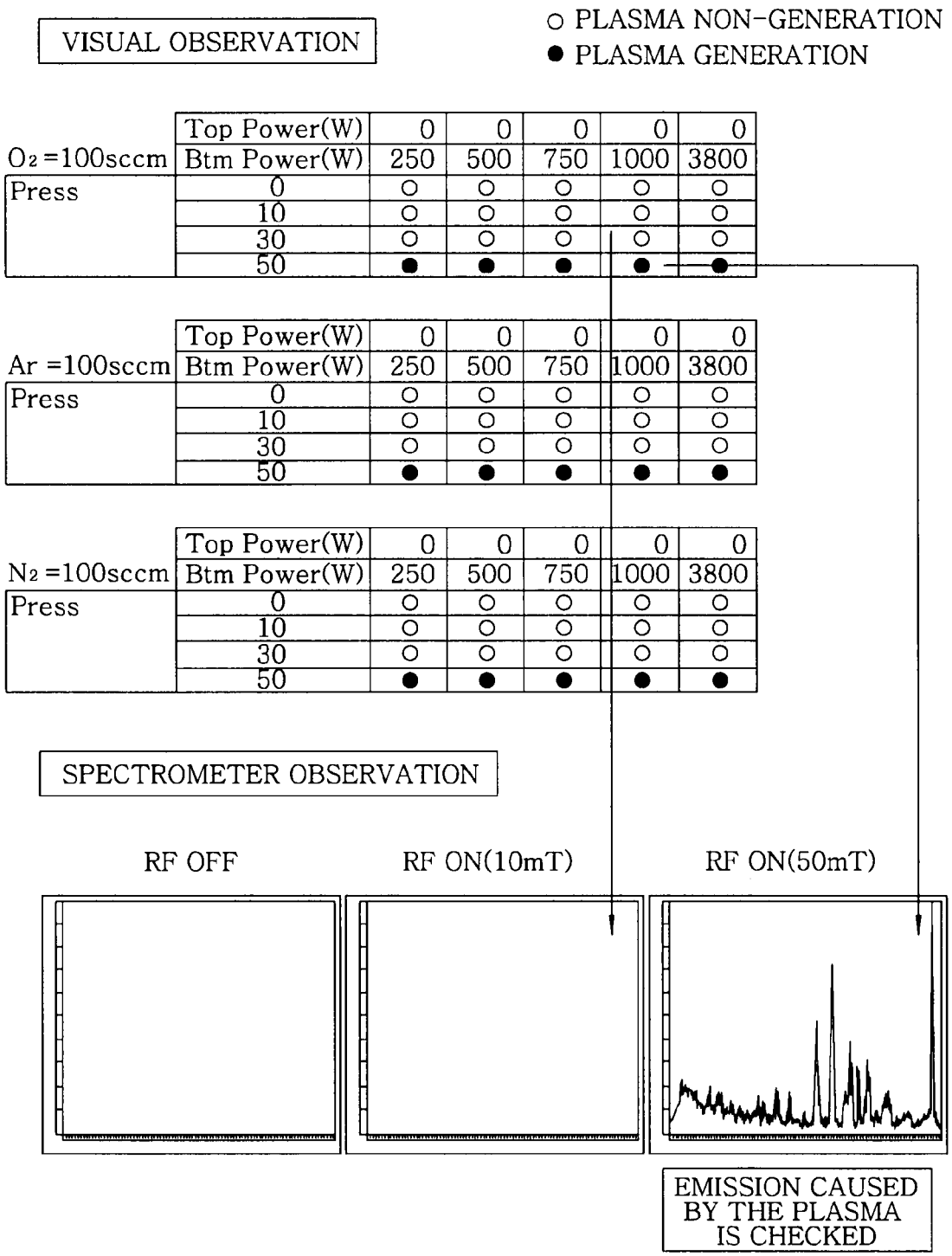
FIG. 3 shows conditions whether or not a plasma is generated.

FIG. 3 shows conditions that no plasma is generated in the vacuum processing chamber 2 examined through the visual observation and spectrometer observation. When no plasma is generated, no waveform of spectra of measured light is displayed in the spectrometer. However, as shown in a lower right portion of FIG. 3, when plasma is generated, waveforms of spectra of measured light is displayed in the spectrometer, thereby confirming that the emission is caused by the plasma.

As shown in FIG. 3, the condition that no plasma was generated was examined by supplying high frequency powers of 250, 500, 750, 1000, and 3800 W, respectively, having a frequency of 13.56 MHz from the second high frequency power supply 50 to the susceptor 5. Further, the examination was performed by supplying $O_2$ gas of 100 sccm, Ar gas of 100 sccm, and $N_2$ gas of 100 sccm, respectively, to the vacuum processing chamber 2; and depressurizing the vacuum processing chamber 2 to 0 Pa (0 mTorr), 1.3 Pa (10 mTorr), 4 Pa (30 mTorr), and 6.7 Pa (50 mTorr). In the meantime, no high frequency power is supplied from the first high frequency power 40.

As a result, no plasma is generated when the pressure of the vacuum processing chamber 2 is equal to or smaller than 4 Pa (30 mTorr) regardless of the kinds of gas and power values. On the other hand, when the pressure of the vacuum processing chamber 2 is depressurized to 6.7 Pa (50 mTorr), a plasma is generated for each kind of gas and each power value. Accordingly, the condition that no plasma is generated can be satisfied by depressurizing the inside of the vacuum pressing chamber 2 to 4 Pa (30 mTorr) or less. That is, if the vacuum pressing chamber 2 is depressurized to a certain value or less, no plasma is generated even though a high frequency power is supplied from the second high frequency power supply 50 to the susceptor 5.

Figure 4:
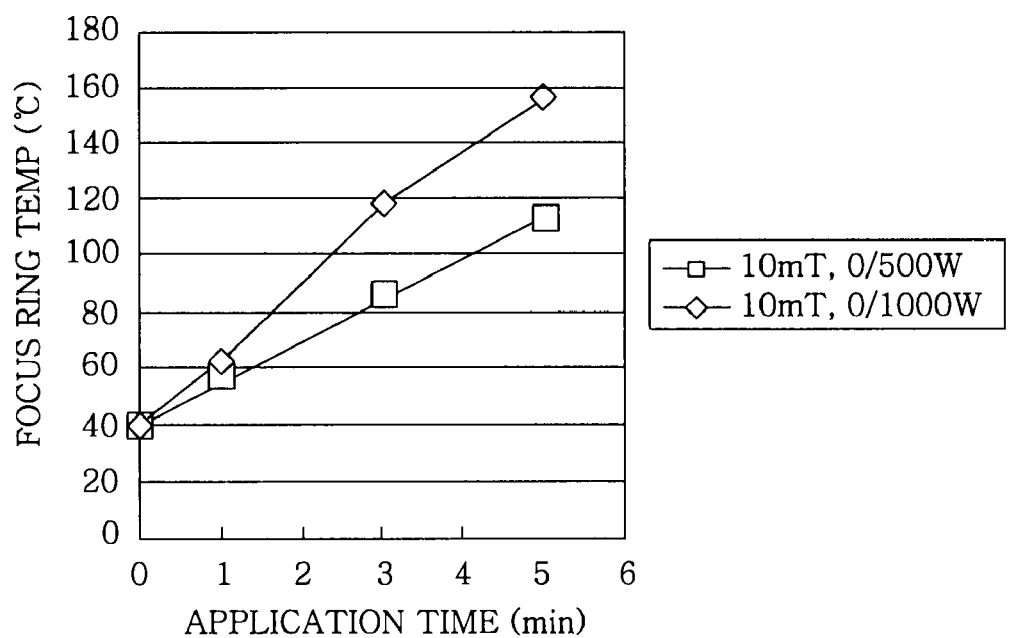
FIG. 4 is a graph showing the relationship between a temperature of a focus ring and a high frequency power application time in accordance with the embodiment of the present invention.

FIG. 4 is a graph showing the relationship between a temperature and a heating time of the focus ring 15, examined when the focus ring 15 is heated by supplying the high frequency power having the frequency of 13.56 MHz from the second high frequency power 50 to the susceptor 5 under the condition that no plasma is generated, where the vertical axis is the temperature and the horizontal axis is the heating time. Further, in this examination, the temperature of the focus ring 15 was measured in cases where the high frequency power was 500 W and 1000 W, respectively, while the $O_2$ gas of 100 sccm was supplied to the vacuum processing chamber 2 and the inside of the vacuum processing chamber 2 was depressurized to 1.3 Pa (10 mTorr).

As shown in FIG. 4, it can be seen that the temperature of the focus ring 15 is increased by supplying both the high frequency powers of 500 W and 1000 W. Further, as the power value of the high frequency power is increased, the temperature of the focus ring 15 is more quickly increased. For the high frequency power of 500 W, the temperature of the focus ring 15 is increased to about 110° C. by heating the focus ring 15 for about 5 minutes. For the high frequency power of 1000 W, the temperature of the focus ring 15 is increased to about 160° C. by heating the focus ring 15 for about 5 minutes. Accordingly, it can be seen that it is possible to increase the temperature of the focus ring 15 to a desired value during a shorter period of time by increasing the power value of the high frequency power.

Figure 5:
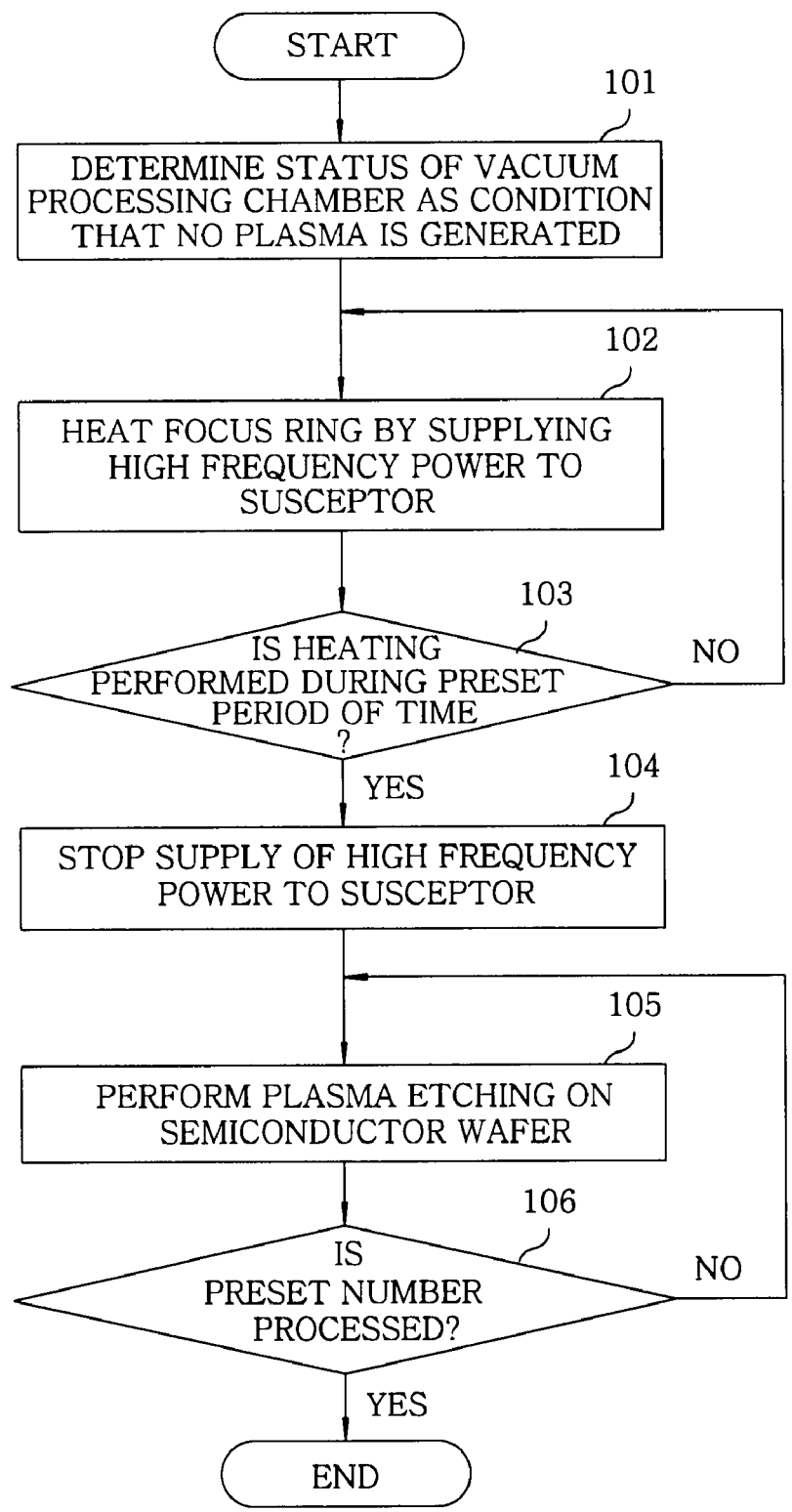
FIG. 5 is a flowchart showing a process of a plasma etching method in accordance with the embodiment of the present invention.

FIG. 5 is a flowchart showing the plasma etching process performed by the plasma etching apparatus 1 in accordance with the present embodiment. As shown in FIG. 5, in the plasma etching apparatus 1, when the plasma etching process is started, the status of the vacuum processing chamber 2 is set to satisfy the condition that no plasma is generated even though a high frequency power is supplied from the second high frequency power supply 50 to the susceptor 5 (step 101). For example, the pressure of the vacuum processing chamber 2 is set to 4 Pa or less.

Next, under the condition that no plasma is generated, the focus ring 15 starts to be heated by supplying the high frequency power from the second high frequency power supply 50 to the susceptor 5 (step 102).

Then, the focus ring 15 is continuously heated by supplying the high frequency power from the second high frequency power supply 50 to the susceptor 5 during a certain period of time such that the temperature of the focus ring 15 is increased to a desired value (step 103) and the supply of the high frequency power to the susceptor 5 is stopped after the certain period of time (step 104).

Thereafter, a semiconductor wafer W is loaded in the vacuum processing chamber 2 and the plasma etching process is started to be performed on the semiconductor wafer W (step 105). After the plasma etching process is performed on a predetermined number of semiconductor wafers W (step 106), the plasma etching process is ended. At this time, the focus ring 15 may be heated while the semiconductor wafer W is mounted on the susceptor 5.

The plasma etching process is performed by, e.g., allowing the process controller 61 to read out a control program stored in the storage unit 63 and control the operations of the elements of the plasma etching apparatus 1.

As such, since the focus ring 15 is heated in advance without a dummy wafer in the present embodiment, it is possible to simplify the plasma etching process as compared with the conventional method. Further, since the focus ring 15 is heated without a plasma, it is possible to prevent the focus ring 15 and other components from being worn out by the plasma. In addition, since the temperature of the focus ring 15 is increased to the desired value in advance, it is possible to uniformly perform the plasma etching process on each semiconductor wafer W.

The present invention is not limited to the above embodiment and various modifications may be made. For example, the plasma etching apparatus may be of a type in which a single or dual high frequency power is supplied to a lower electrode without being limited to the parallel plate type in which high frequency powers are supplied to the upper and the lower electrode as shown in FIG. 1.

In accordance with the embodiment of the present invention, it is possible to provide a focus ring heating method, a plasma etching method, a plasma etching apparatus, and a computer-readable storage medium, in which members inside the vacuum chamber can be suppressed from being worn out without requiring a dummy substrate as compared with the conventional method.

While the invention has been shown and described with respect to the embodiments, it will be understood by those skilled in the art that various changes and modification may be made without departing from the scope of the invention as defined in the following claims.

What is claimed is:

1. A method for heating a focus ring in a plasma etching apparatus including a vacuum processing chamber; a lower electrode provided in the vacuum processing chamber, the lower electrode also serving as a mounting table for mounting a substrate thereon; an upper electrode provided to face the lower electrode; a gas supply unit for supplying a processing gas to the vacuum processing chamber; a high frequency power supply unit for supplying a high frequency power to the lower electrode; and a focus ring provided on the lower electrode to surround a periphery of the substrate, the method comprising:

heating the focus ring by supplying the high frequency power from the high frequency power supply unit to the lower electrode under a condition that no plasma is generated.

2. The method of claim 1, wherein the focus ring is heated by supplying the high frequency power from the high frequency power supply unit to the lower electrode while the vacuum processing chamber is depressurized to about 4 Pa or less.

3. The method of claim 1, wherein the focus ring is heated by supplying the high frequency power from the high frequency power supply unit to the lower electrode while the substrate is not mounted on the lower electrode.

4. The method of claim 2, wherein the focus ring is heated by supplying the high frequency power from the high frequency power supply unit to the lower electrode while the substrate is not mounted on the lower electrode.

5. A method for performing a plasma etching on a substrate by using a plasma etching apparatus including a vacuum processing chamber; a lower electrode provided in the vacuum processing chamber, the lower electrode also serving as a mounting table for mounting the substrate thereon; an upper electrode provided to face the lower electrode; a gas supply unit for supplying a processing gas to the vacuum processing chamber; a high frequency power supply unit for supplying a high frequency power to the lower electrode; and a focus ring provided on the lower electrode to surround a periphery of the substrate, the method comprising:

heating the focus ring by supplying the high frequency power from the high frequency power supply unit to the lower electrode under a condition that no plasma is generated; and generating a plasma in the vacuum processing chamber to perform the plasma etching on the substrate by using the plasma.

6. The method of claim 5, wherein the focus ring is heated by supplying the high frequency power from the high frequency power supply unit to the lower electrode while the vacuum processing chamber is depressurized to about 4 Pa or less.

7. The method of claim 5, wherein the focus ring is heated by supplying the high frequency power from the high frequency power supply unit to the lower electrode while the substrate is not mounted on the lower electrode.

8. The method of claim 6, wherein the focus ring is heated by supplying the high frequency power from the high frequency power supply unit to the lower electrode while the substrate is not mounted on the lower electrode.

\* \* \* \* \*